(12) United States Patent
Hanoka et al.

(10) Patent No.: US 6,278,053 B1
(45) Date of Patent: *Aug. 21, 2001

(54) DECALS AND METHODS FOR PROVIDING AN ANTIREFLECTIVE COATING AND METALLIZATION ON A SOLAR CELL

(75) Inventors: Jack I. Hanoka, Brookline; Brynley E. Lord, Arlington; Mark T. Mrowka, Lunenburg; Xinfa Ma, Lexington, all of MA (US)

(73) Assignee: Evergreen Solar, Inc., Waltham, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/823,857

(22) Filed: Mar. 25, 1997

(51) Int. Cl.$^7$ .................................................. H01L 31/00
(52) U.S. Cl. ........................... 136/256; 136/252; 136/259
(58) Field of Search .................... 136/252, 256, 136/259

(56) References Cited

U.S. PATENT DOCUMENTS

| 3,261,074 | 7/1966 | Beauzee | 29/25.3 |
|---|---|---|---|
| 3,502,507 | 3/1970 | Mann | 136/89 |
| 3,903,427 | 9/1975 | Pack | 250/578 |
| 3,903,428 | 9/1975 | DeJong | 250/578 |
| 3,990,100 | 11/1976 | Mamine et al. | 357/30 |
| 4,131,488 | 12/1978 | Lesk et al. | 148/1.5 |
| 4,133,697 | 1/1979 | Frosch et al. | 136/245 |

(List continued on next page.)

FOREIGN PATENT DOCUMENTS

WO8912911   6/1989   (WO) .

OTHER PUBLICATIONS

*Technical Information Bulletin*, by Philadelphia Decal, (1993), pp. 1–2, (No month).

"How to Use Decals in Decorating", Philadelphia Ceramics, Inc., pp. 1–4, (No date).

"The Making of A Decal", *The Plate Collector*, Dec. 1985, pp. 33–35.

Cavicchi et al., "Large Area Wraparound Cell Development", *IEEE*, 1984, pp. 128–133, No month.

Michaels et al., "Large Area, Low Cost Space Solar Cells with Optional Wraparound Contacts", *IEEE*, 1981, pp. 225–227, No month.

Mason et al., "Development of 2.7 mil BSF and BSFR Silicon Wrapthrough Solar Cells", *IEEE*, 1990, pp. 1378–1382, No month.

Gee et al., "Emitter Wrap–Through Solar Cell", *IEEE*, 1993, pp. 265–270, No month.

Thornhill, *Final Report—Automated Fabrication of Back Surface Field Silicon Solar Cells with Screen Printed Wraparound Contacts*, prepared for NASA, 1977, pp. 1–30, No month.

(List continued on next page.)

*Primary Examiner*—Cathy Lam
(74) *Attorney, Agent, or Firm*—Testa, Hurwitz & Thibeault, LLP

(57) ABSTRACT

A decal for use in forming a solar cell comprises an antireflective precursor material and a patterned electrically conductive material. The antireflective precursor material and the patterned electrically conductive material are disposed over a base material. The antireflective precursor material can be one or more layers of paste which form an antireflective coating upon being fired. A cover layer can be disposed over the antireflective precursor material and the electrically conductive material.

11 Claims, 3 Drawing Sheets

U.S. PATENT DOCUMENTS

| | | | |
|---|---|---|---|
| 4,135,290 | | 1/1979 | Evans ........................................ 437/2 |
| 4,173,820 | | 11/1979 | Frosch et al. ............................ 437/2 |
| 4,181,755 | * | 1/1980 | Liu et al. .............................. 136/256 |
| 4,240,842 | * | 12/1980 | Lindmayer ........................... 136/256 |
| 4,331,703 | * | 5/1982 | Lindmayer ........................... 136/256 |
| 4,361,950 | | 12/1982 | Amick ..................................... 437/2 |
| 4,415,607 | | 11/1983 | Denes et al. ........................... 427/96 |
| 4,415,780 | | 11/1983 | Daugherty et al. .................. 200/5 A |
| 4,444,992 | * | 4/1984 | Cox, III .............................. 136/256 |
| 4,463,216 | * | 7/1984 | Nakano et al. ...................... 136/256 |
| 4,543,444 | | 9/1985 | Rasch et al. ......................... 136/256 |
| 4,610,077 | | 9/1986 | Minahan et al. ......................... 437/2 |
| 4,649,088 | * | 3/1987 | Mitsui et al. ........................ 136/256 |
| 4,692,557 | | 9/1987 | Samuelson et al. ................. 136/251 |
| 4,755,866 | | 7/1988 | Marshall et al. ........................ 357/81 |
| 4,758,926 | | 7/1988 | Herrell et al. ........................ 361/385 |
| 4,849,028 | | 7/1989 | Krause ................................. 136/201 |
| 4,860,444 | | 8/1989 | Herrell et al. ........................ 29/840 |
| 4,897,123 | | 1/1990 | Mitsui .................................. 136/256 |
| 4,912,288 | | 3/1990 | Atkinson et al. ..................... 174/251 |
| 4,966,631 | | 10/1990 | Matlin et al. ........................ 136/244 |
| 5,055,907 | | 10/1991 | Jacobs .................................... 357/71 |
| 5,108,541 | | 4/1992 | Schneider et al. ................... 156/631 |
| 5,116,427 | * | 5/1992 | Fan et al. ............................. 136/256 |
| 5,116,459 | | 5/1992 | Kordus et al. ....................... 156/631 |
| 5,118,362 | | 6/1992 | St. Angelo et al. ................. 136/256 |
| 5,143,556 | | 9/1992 | Matlin .................................. 136/244 |
| 5,151,377 | | 9/1992 | Hanoka et al. ........................... 437/2 |
| 5,270,248 | | 12/1993 | Rosenblum et al. ................. 437/160 |
| 5,425,816 | | 6/1995 | Cavicchi et al. ..................... 136/256 |
| 5,476,553 | | 12/1995 | Hanoka et al. ...................... 136/251 |
| 5,478,402 | | 12/1995 | Hanoka ............................... 136/251 |
| 5,620,904 | | 4/1997 | Hanoka ................................. 438/98 |
| 5,726,065 | * | 3/1998 | Szlufcik et al. ..................... 136/256 |

OTHER PUBLICATIONS

Product Brochure for Formion®Formulated Ionomer, by A. Schulman Inc., Resisns, pp. 1–3, No date.

*The Rotary Press*, newsletter from Philadelphia Decal, vol. I, Issue No. 2, Sep. 1993, pp. 1–2, No month.

Baker et al., "Introduction of Acrylate Copolymer Based Ionomer Resins for Packaging Applications", pp. 1–20, No date.

Anonymous; "Decal Interconnection Bonding Method"; *IBM Technical Disclosure Bulletin*; vol. 10; No. 7; Dec. 1967; pp. 1074–1075; XP002088435.

Anonymous; "Interconnection Decal Employing Silicon Adhesive" *IBM Technical Disclosure Bulletin*; vol. 10; No. 11; Apr. 1968; pp. 1667–1668; XP002088436.

Anonymous; "Silicon–on–Silicon– The Integral Decal"; *IBM Technical Disclosure Bulletin*; vol. 33; No. 1A; Jun. 1990; pp. 174–175; XP002088437.

* cited by examiner

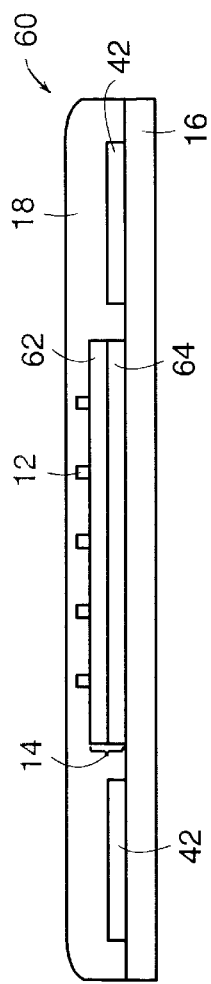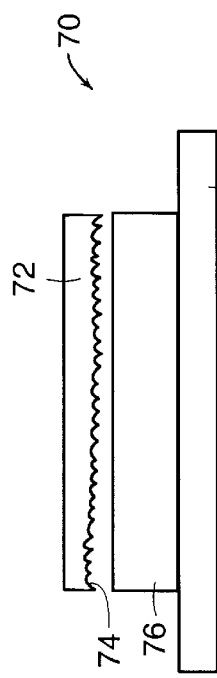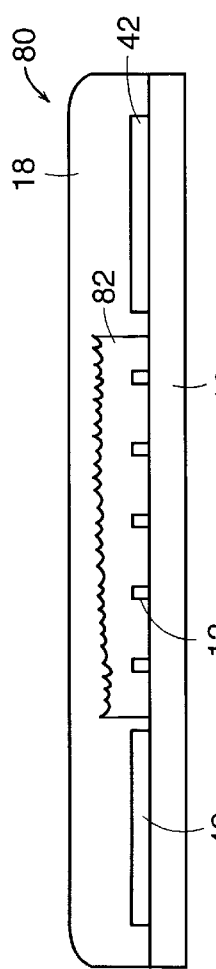

DECALS AND METHODS FOR PROVIDING AN ANTIREFLECTIVE COATING AND METALLIZATION ON A SOLAR CELL

FIELD OF THE INVENTION

The invention relates to decals and methods for manufacturing decals for use in solar cells. More particularly, the invention relates to decals and methods for manufacturing decals having an antireflective coating and metallization for use in forming a solar cell.

BACKGROUND

Solar cells are semiconductor devices that convert sunlight into electricity. The principle barrier to wider use of solar cells as a source of electrical power is their cost. To lower the cost of manufacturing solar cells, it is important to develop manufacturing methods which involve very few steps and very little handling and which are capable of very high throughput rates.

One method for lowering the manufacturing cost of solar cells is to reduce the number of overall processing steps. Each step requires a considerable amount of handling, resulting in higher labor cost and adding to the risk of reducing yield. Another method for lowering the manufacturing cost is to simplify each processing step.

By way of background, a crystalline silicon solar cell is made by forming a p-n junction on a silicon substrate, applying front and rear electrical contacts to the solar cell, and covering the front surface of the solar cell with an antireflective coating. The metallization step for the front contact, the metallization step for the rear contact, and the antireflective coating step are performed as separate processes, thereby adding complexity and cost. Also, the antireflective coating step is sometimes performed after the metallization step for the front contact, resulting in the antireflective coating covering the front contact. In such a case, another step, to remove portions of the antireflective coating, is required to access the front contact.

In order to increase light trapping and conversion efficiency, a single crystalline silicon solar cell can be textured using a chemical etching process. When etched, such a solar cell substrate reveals pyramid structures which reflect the incident light back into the solar cell. A polycrystalline silicon solar cell, however, cannot be textured by the chemical etching process due to its various crystallographic orientations. One solution to this problem is texturing an antireflective coating placed on a surface of the polycrystalline silicon solar cell. A known method of texturing an antireflective coating is through a two layer chemical vapor deposition process, which is expensive and slow.

Therefore, a need exists for a method for forming electrical contacts and antireflective coatings on solar cells that is simple and inexpensive.

SUMMARY OF THE INVENTION

The present invention features decals and decal methods for forming electrical contacts and antireflective coatings on solar cells. The invention facilitates the production of solar cells, with high device yield and low manufacturing cost, by reducing the demand for labor, by eliminating the need for a specialized equipment, and by providing a simple procedure that can be performed rapidly. The invention is elegant, yet simple, and amenable to automation and mass production.

In one aspect, the invention features a decal for use in forming a solar cell. The decal comprises an antireflective precursor material and a patterned electrically conductive material. At least a portion of the electrically conductive material is disposed adjacent the antireflective precursor material. The antireflective precursor material, which can be textured, can be disposed over a base material. The antireflective precursor material can be one or more layers of paste which form an antireflective coating upon being fired. The base material can be a water-sensitive paper, or a polymer material, or comprise a wax coating. A cover layer can be disposed over the electrically conductive material. Alternatively, the patterned electrically conductive material can be placed over the base material, and the antireflective precursor material can be placed over the electrically conductive material.

In another aspect, the invention features a method of manufacturing a decal for use in forming a solar cell. An antireflective precursor material is formed (e.g., by printing and drying) over a base material. A patterned electrically conductive material is formed (e.g., by printing and drying) over the antireflective precursor material. A cover layer can be formed (e.g., by printing and drying) over the electrically conductive material. Alternatively, the placement of the antireflective precursor material and the electrically conductive material may be reversed.

In another aspect, the invention features a method of manufacturing a decal for use in forming a solar cell. An antireflective precursor material is formed (e.g., by printing and drying) of multiple layers of materials that form a graded layer of antireflective coating. A patterned electrically conductive material is formed (e.g., by printing and drying) adjacent the antireflective precursor material and a cover layer can be formed (e.g., by printing and drying) over the antireflective precursor material and the electrically conductive material.

In another aspect, the invention features a method of forming an antireflective precursor material on a solar cell. A decal having a base material and an antireflective precursor material disposed over the base material is provided. A patterned die is placed in contact with the antireflective precursor material to form a textured pattern in the antireflective precursor material. The patterned die can be capable of mechanically texturing the antireflective precursor material. The decal is positioned on at least one surface of a solar cell. The decal is processed (e.g., fired) to convert the antireflective precursor material into a textured antireflective coating. In this case, the antireflective precursor is made to be considerably thicker than in other embodiments.

In another aspect, the invention features a method of manufacturing a solar cell using a decal comprising an antireflective precursor and a patterned electrically conductive material disposed adjacent to the antireflective precursor material The decal is placed on at least one surface of the solar cell. The decal is processed to remove organic matter, form an antireflective coating, and form an ohmic contact for the solar cell.

In another aspect, a portion of the decal can be wrapped around at least one edge of the solar cell for contacting a second surface of the solar cell. In one embodiment for this configuration, the patterned electrically conductive material forms a front contact on the first surface of the solar cell and another patterned electrically conductive material forms a rear contact on a second surface of the solar cell. The antireflective precursor is disposed adjacent the front contact. In another embodiment, the patterned electrically conductive material is capable of forming a wraparound contact such that a first portion (e.g. the fingers) of the contact is disposed adjacent a first surface of the solar cell and a second portion (e.g. the busbar) of the contact is wrapped around at least one edge of the solar cell to a second surface of the solar cell. In this embodiment, the antireflective precursor is disposed adjacent the first portion of the contact.

The antireflective precursor can be sprayed onto the base material. In such cases, spraying can be done after the front metal contact is formed on the decal. Alternatively, the antireflective precursor can be printed over the front metal contact after the contact has been printed onto the base material. In such cases, the antireflective precursor can be printed so as not to cover the busbars of the front metal contact or the rear metal contact.

In yet another aspect, the invention features a solar cell assembly and method of forming such an assembly. The assembly comprises a solar cell, a textured antireflective coating and a patterned electrical contact. The textured antireflective coating can be disposed on a first surface of the solar cell. The patterned electrical contact is disposed on the textured antireflective coating and can be disposed on the solar cell. Alternatively, the electrical contact can be disposed on at least the first surface of the solar cell and the textured antireflective coating can be disposed on the portion of the electrical contact adjacent the first surface of the solar cell.

BRIEF DESCRIPTION OF THE DRAWINGS

These and other features of the invention are more fully described below in the detailed description and accompanying drawings.

FIG. 6 shows a cross-sectional view of a decal with both front and rear electrical contacts and a multi-layered antireflective coating.

FIG. 7 illustrates means for texturing an antireflective coating using a patterned die.

FIG. 8 shows a cross-sectional view of a decal with both front and rear electrical contacts and a textured antireflective coating.

DETAILED DESCRIPTION

Figure 1:
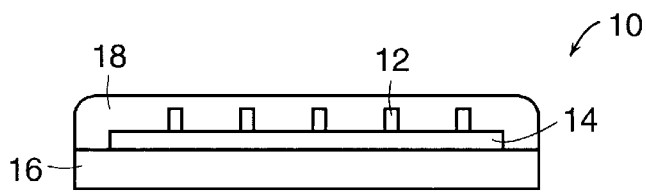
FIG. 1 shows a cross-sectional view of a decal with electrical contacts and an antireflective coating.

FIG. 1 shows a cross-sectional view of a decal 10 for forming front electrical contacts and an antireflective coating on a solar cell. The decal 10 comprises a base material 16, an antireflective precursor material 14, an electrically conductive material 12 for a front contact and a cover layer 18. The antireflective precursor material 14 is disposed on the base material 16. The electrically conductive material 12 is patterned and disposed on the antireflective precursor material 14. The cover layer 18 is disposed over the electrically conductive material 12. When the decal 10 is transferred onto a solar cell substrate, the decal 10 is first detached from the base material 16 and is then held together with the cover layer 18.

The base material 16 can be, for example, a water-sensitive paper, a polymeric material, a base comprising a wax coating or any other suitable base material for a decal process. The antireflective precursor material 14 comprises a material that forms an antireflective coating upon further processing. In one embodiment, the antireflective precursor material 14 is a paste comprising a material which forms an antireflective coating of $TiO_2$ upon being fired. Other materials which could be formed in this manner include other metal oxides such as $Ta_2O_5$, $SiO_2$, $Al_2O_3$, SiO, ZnO and mixtures of these oxides. Silicon nitride could also be formed in this manner. The antireflective precursor material 14 may be disposed on the base material 16 in any manner suitable for a decal process. For example, the antireflective precursor material 14 can be printed on the base material 16 and dried before the electrically conductive material 12 is placed on it. Examples of suitable printing processes include screen printing, stencil printing, pad printing, rotogravure printing, direct write methods wherein a metal containing paste is extruded through a nozzle, and any other suitable thick film printing techniques known in the art. Alternatively, the antireflective precursor material 14 may be sprayed on the base material 16.

The electrically conductive material 12 is patterned to form front electrical contacts on a solar cell. By placing the antireflective precursor material 14 under the electrically conductive material 12, the contacts for the solar cell are exposed. In this way, the contacts can be directly accessed for soldering or interconnection without having to remove the antireflective coating. The electrically conductive material 12 can comprise nickel, aluminum or silver and be disposed on the antireflective precursor material using any method suitable for a decal process. For example, the electrically conductive material 12 can be printed over the antireflective precursor material 14 and dried before the cover layer 18 is placed on it. The cover layer 18 is used to support and bind the decal 10. When the decal 10 is to be transferred onto a solar cell substrate, it is removed from the base material 16 and the cover layer 18 serves to hold the decal 10 together. An acrylic-based material, for example, may be used as the cover layer 18.

The electrically conductive material 12 may be patterned in any manner to form suitable electrical contacts. Typically, a solar cell has a front contact on a front surface of the solar cell and a rear contact on a back surface. As shown in FIG. 1, the electrically conductive material 12 is patterned to form the front contact on a solar cell. More particularly, the electrically conductive material 12 is patterned to form a wraparound contact for the solar cell.

Figure 2:
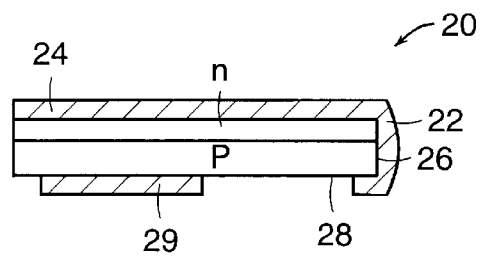
FIG. 2 shows a cross-sectional view of a solar cell with a wraparound contact.

FIG. 2 shows a cross-sectional view of a solar cell 20 with a wraparound contact 22. With a wraparound contact 22, a portion of the contact is disposed adjacent a first surface 24 of the solar cell 20 and the remainder of the contact is wrapped around an edge 26 of the cell to a second surface 28. The first surface 24 is the side which is exposed to the sun. A rear contact 29 is disposed on the second surface 28.

Figure 3:
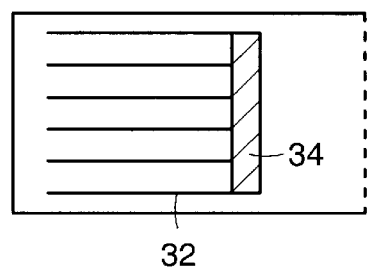
FIG. 3 shows a top view of a decal used to form a wraparound contact.

FIG. 3 shows a top view of a decal 30 with a metallization pattern patterned to form a wraparound contact. The pattern comprises fingers 32 and a busbar 34. The decal 30 can be wrapped around a solar cell (not shown) so that fingers 32 contact a front surface of the cell and wrap around the edge of the cell, while the busbar 34 contacts the back of the cell. An advantage of a wraparound contact is that the front contact becomes accessible from the back of the solar cell.

In other words, both the front contact and the rear contact become accessible from the same side. Decal processes may be used to form both the front contact and the rear contact by means of a single patterned decal or two independent decals. Alternatively, the rear contact may be formed using other known metallization methods.

Figure 4:
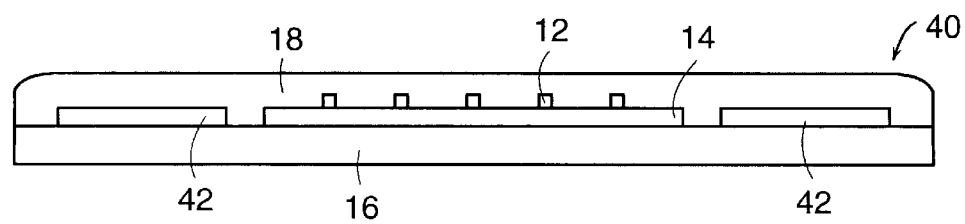
FIG. 4 shows a cross-sectional view of a decal with both front and rear electrical contacts and an antireflective coating.

FIG. 4 shows an example of a decal 40 having a metallization pattern that allows both the front contact and the rear contact to be made in a single step. The decal 40 includes the base material 16, the antireflective precursor material 14, the electrically conductive material 12 and the cover layer 18 (formed as described above in connection with FIG. 1). The decal 40 has several additional layers of electrically conductive material 42 disposed over the base material 16. These layers 42 form rear contacts once the decal 40 is wrapped around a solar cell and processed.

Figure 5:
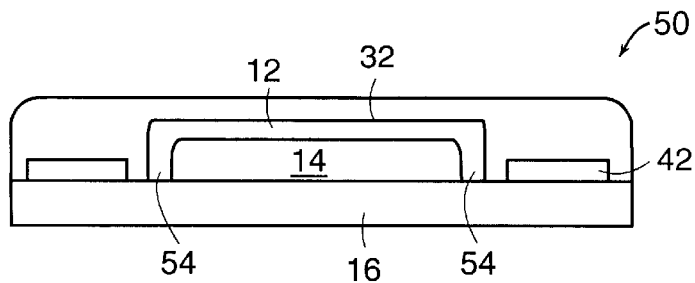
FIG. 5 is a cross-sectional view across a finger of a wraparound contact with two busbars.

FIG. 5 shows another example of a decal 50 capable of forming both the front contact and the rear contact in a single step. This figure is a cross-sectional view across one finger 32 of a wraparound contact. The decal 50 includes the base material 16, the antireflective precursor material 14, the electrically conductive material 12 to form the wraparound contact, and additional layers of electrically conductive material 42 to form the rear contact (formed as described above in connection with FIG. 1 and FIG. 4). The wraparound contact also comprises two busbars 54.

The antireflective precursor material 14 can comprises a single layer (FIG. 1) or can comprise multiple layers 62, 64 of materials that form a graded layer of antireflective coating upon processing (FIG. 6). The decal 60 in FIG. 6 includes the base material 16, multiple layers of antireflective precursor material 62, 64, the electrically conductive material 12 to form a front contact, and additional layers of electrically conductive material 42 to form a rear contact. Each layer 62, 64 can be a paste having a mixture of materials that form antireflective coatings upon being fired. An example of such paste is materials capable of forming a mixture of $SiO_2$ and $TiO_2$ with a refractive index well below 2.0 upon being fired. By varying the amount of $SiO_2$ in each layer, the refractive index of the final coating can be graded. In both a single and multiple layer configurations, the paste disposed over the base material 16 has a thickness sufficient to render a final antireflective coating with a thickness in the range of 500 to 1500 angstroms.

FIG. 7 illustrates a method of texturing the antireflective precursor material 14 to form a textured antireflective coating on a solar cell (not shown). A decal 70 comprises a base material 16 and an antireflective precursor material 76 disposed over the base material 16. The antireflective precursor material 76 can be a thick layer of paste. The paste layer 76 has a thickness sufficient to render a final antireflective coating having a thickness of approximately several microns. The antireflective precursor material 76 is mechanically textured by placing a die 72 in contact with the antireflective precursor material 76. More particularly, the die 72 is pressed against or pushed into the precursor material 76 to form a textured pattern in the antireflective precursor material 76. The die 72 used in the texturing step comprises a textured pattern 74 on one surface. The textured pattern 74 in the die 72, for example, may be formed by chemically etching a single crystal silicon wafer revealing pyramid patterns or by laser machining a metal or polymer surface. The electrically conductive material 12 and the cover coat 18 may be disposed over the textured antireflective precursor material 76, since the textured pattern is preserved throughout these steps and the final antireflective coating maintains the textured pattern.

FIG. 8 shows a decal 80 having an electrically conductive material 12 for a front contact disposed over the base 16, a textured antireflective precursor material 82 disposed over the electrically conductive material 12, an electrically conductive material 42 for the rear contact, and a cover layer 18 disposed over the textured antireflective precursor material 82. This texturing method can be used to form both single crystalline and polycrystalline solar cells with greater efficiency.

Figure 9A:
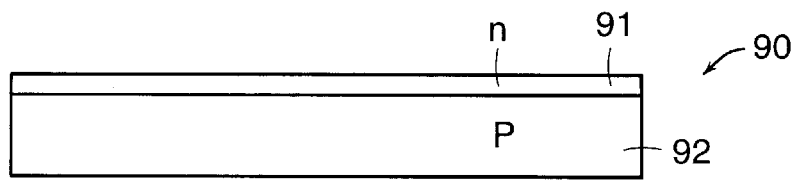
FIGS. 9a–9d illustrate a method of forming contacts on a solar cell using a decal.
Figure 9B:
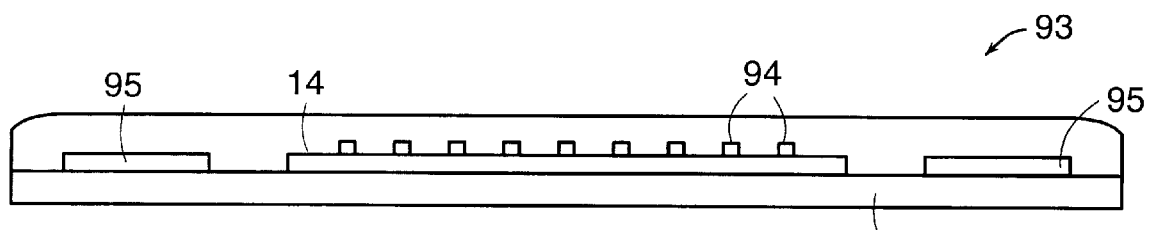

The decals shown in FIGS. 1–8 may be used to manufacture solar cells. FIGS. 9a–9d illustrate a method of forming front and rear contacts using a single decal. While the methods for manufacturing solar cells 96 are described below with respect to the decal 93 embodied in FIGS. 9a–9d, the methods apply equally to other decals of the present invention. FIG. 9a shows a typical silicon solar cell structure 90 where only a p-n junction 91, 92 has been formed. Referring to FIG. 9b, a decal 93 comprising a base material 16, an antireflective precursor material 14, an electrically conductive material for a front contact 94, an electrically conductive material for a rear contact 95, and a cover layer 18 is first prepared according to the methods discussed above. The base material 16 is then separated from the decal 93 using one of several available methods. In one embodiment, where a water-sensitive paper is used as the base material 16, water is used to perform the separation. The decal 93 is wetted by either spraying with water, immersing the decal 93 in water, or using a sponge paint roller. The paper curls and this effects a separation of the decal 93, supported by the cover layer 18, from the water-sensitive paper 16. The decal 93 is placed in contact with a solar cell 90. To make a wraparound contact, the decal 93 is wrapped around the solar cell 90. The paper can be coated with a material which provides a temporary adhesive to affix the decal 93 to the solar cell 90.

It is typically desirable to remove excess water disposed between the decal 93 and the solar cell 90 before further processing. This may be accomplished by a number of techniques, including through mechanical pressure. The solar cell 90 and decal 93 are then dried to ensure that the decal 93 is in intimate contact with the juxtaposed surfaces of the solar cell 90. The solar cell 90 and decal 93 may be dried at either ambient temperature or an elevated temperature.

Alternatively, heat may be used to separate the base material 16 from the decal 93. This method works when the decal 93 is disposed on a waxen surface of the base material 16. The decal 93 is heated to soften the wax and loosen the decal 93 from the base material 16. The decal 93 is placed in contact with solar cell 90 which can also be heated slightly. The softened wax may provide a temporary adhesive to affix the decal 93 to the solar cell 90.

An additional method of separating the base from the decal is to use a low tack contact adhesive deposited on a backing paper coated with silicone or its equivalent. The decal 93 is prepared on top of the adhesive. The finished decal 93 is then mechanically peeled off the backing paper and affixed to the solar cell. This method relies on the adhesive having greater adhesion to the decal material then to the backing paper.

Figure 9C:
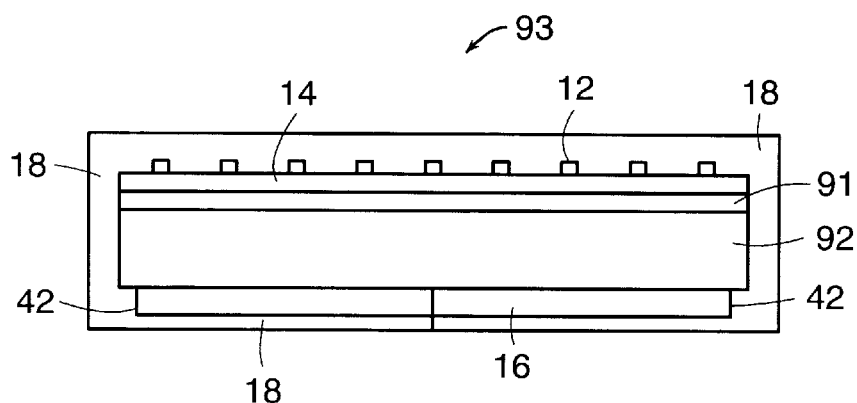

After the base material 16 has been separated from the decal 93, the decal 93 is placed on a solar cell 90 as shown in FIG. 9c. Once the decal 93 is in contact with the solar cell 90, the decal 93, along with the solar cell 90 is fired. Organic materials associated with components of the decal 93 are volatilized during the firing cycle. The firing profile is optimized for the dimensional and electronic parameters of the substances used to form contacts. One object of the firing process is to obtain uniform adhesion across the solar cell 90 and to adequately volatilize the organic materials. For example, if the metallization consists of silver paste, a spike-firing profile is effective. Spike-firing involves heating the solar cell 20 to the desired peak temperature and then rapidly cooling it. At its peak, the spike portion of the thermal profile may reach between 700–800° C. Since the surface of the solar cell 90 is coated with an anti-reflective material 14, a firing cycle must be implemented to ensure that the metallization fires through the anti-reflective coating to form proper electrical contact between the electrode and the underlying diffused region of the solar cell 90.

It is advantageous to use a decal 93 with metallization comprising a frit-bonded material, such as frit-bonded silver paste. Frit-bonded paste comprises glass frit that becomes molten under standard firing conditions and then dissolves a small surface region of the underlying material. Since the surface of the diffused region has an anti-reflective coating, such as silicon nitride or titanium dioxide, the glass frit dissolves the adjacent portion of the anti-reflective coating 14, yielding access of the metallization to the underlying diffused region. When the solar cell 90 is properly fired, a strong mechanical bond is formed to the surface of the cell and ohmic contact to the diffused layer is produced. If improperly fired, however, organic materials may not be adequately removed, which can result in the oxides of the glass frit being reduced. When the frit is reduced, it cannot form an adequate contact, either electrically or mechanically, to the silicon substrate.

Figure 9D:
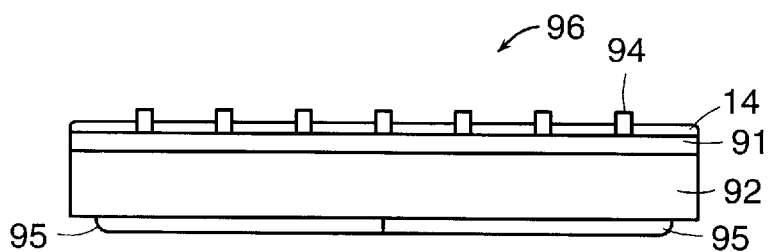

FIG. 9d shows the finished solar cell 96 after firing and burning off the organic materials. The front contact 94, the antireflective coating 14, and the rear metal contact 95 are part of the finished solar cell 96.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A decal for use in forming a solar cell comprising:
   a base material;
   an antireflective precursor material; and
   a patterned electrically conductive material, wherein at least a portion of the electrically conductive material is disposed adjacent the antireflective precursor material, and the base material is disposed adjacent the antireflective precursor material or the patterned electrically conductive material.

2. The decal of claim 1 wherein the base material is disposed adjacent the antireflective precursor material the base material further comprising a cover layer disposed adjacent the electrically conductive material and the antireflective precursor material.

3. The decal of claim 1 wherein the base material is disposed adjacent the electrically conductive material and further comprising a cover layer disposed adjacent the antireflective precursor material.

4. The decal of claim 1 wherein the antireflective precursor material is a single layer of a paste which forms an antireflective coating upon being fired.

5. The decal of claim 1 wherein the antireflective precursor material comprises multiple layers of pastes which form an antireflective coating comprising a graded refractive index upon being fired.

6. The decal of claim 1 wherein the antireflective precursor material is textured.

7. The decal of claim 1 wherein the electrically conductive material forms a wraparound contact such that the portion of the electrically conductive material adjacent the antireflective precursor material is disposed adjacent a first surface of a solar cell and a remaining portion of the electrically conductive material wraps around at least one edge of the solar cell to a second surface of the solar cell.

8. The decal of claim 2 wherein the electrically conductive material further comprises a first electrically conductive material being disposed adjacent the antireflective material and for forming a front contact of a solar cell and a second electrically conductive material being disposed adjacent the base material and for forming a rear contact of the solar cell.

9. The decal of claim 1 wherein the base material comprises a water sensitive paper.

10. The decal of claim 1 wherein the base material comprises a wax coating.

11. The decal of claim 1 wherein the base material comprises a polymer.

* * * * *